(12) United States Patent
Ishii et al.

(10) Patent No.: US 7,649,310 B2
(45) Date of Patent: Jan. 19, 2010

(54) WHITE LED, BACKLIGHT USING SAME AND LIQUID CRYSTAL DISPLAY

(75) Inventors: Tsutomu Ishii, Kanagawa-ken (JP); Hajime Takeuchi, Kanagawa-ken (JP); Yasuhiro Shirakawa, Kangawa-ken (JP); Yasumasa Ooya, Kanagawa-ken (JP); Ryo Sakai, Kanagawa-ken (JP); Masahiko Yamakawa, Kangawa-ken (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 252 days.

(21) Appl. No.: 11/722,768

(22) PCT Filed: Dec. 20, 2005

(86) PCT No.: PCT/JP2005/023369
§ 371 (c)(1),
(2), (4) Date: Jun. 25, 2007

(87) PCT Pub. No.: WO2006/068141
PCT Pub. Date: Jun. 29, 2006

(65) Prior Publication Data
US 2008/0106186 A1    May 8, 2008

(30) Foreign Application Priority Data
Dec. 24, 2004   (JP)   ............................. 2004-372863
Dec. 24, 2004   (JP)   ............................. 2004-372864

(51) Int. Cl.
*H01J 1/62*   (2006.01)

(52) U.S. Cl. ...................................... 313/503; 313/498
(58) Field of Classification Search ................. 313/498, 313/503, 512
See application file for complete search history.

(56) References Cited

U.S. PATENT DOCUMENTS

2002/0063301 A1   5/2002  Hanamoto et al.

FOREIGN PATENT DOCUMENTS

| JP | 2002 171000 | 6/2002 |
| JP | 2003 21821 | 1/2003 |
| JP | 2003 75821 | 3/2003 |
| JP | 2003-75821 | 3/2003 |

OTHER PUBLICATIONS

Moriya, N. et al.,"New Color Filter for Light-Emitting Diode Back Light", Jpn. J. Appl. Phys., vol. 42, No. 4A, pp. 1637-1641, 2003.

*Primary Examiner*—Vip Patel
(74) *Attorney, Agent, or Firm*—Oblon, Spivak, McClelland, Maier & Neustadt, L.L.P.

(57) ABSTRACT

The present invention provides a white LED comprising: an ultraviolet emitting diode or a purple light emitting diode; and phosphors for emitting at least three visible lights including blue light, green light and red light; wherein an emission spectrum of the white LED has: a first luminescence peak in a blue light region having a wavelength of 440-460 nm; a second luminescence peak in a green light region having a wavelength of 510-530 nm; and a third luminescence peak in a red light region having a wavelength of 620-640 nm. Further, it is preferable that a half bandwidth of each of the luminescence peaks is 50 nm or less. As a result, there can be provided a white LED, backlight and liquid crystal display using the white LED exhibiting a high luminance and an excellent color reproducing property.

9 Claims, 5 Drawing Sheets

EMISSION SPECTRUM OF WHITE LED

WHITE LED, BACKLIGHT USING SAME AND LIQUID CRYSTAL DISPLAY

TECHNICAL FIELD

The present invention relates to a white LED (light emitting diode), a backlight and a liquid crystal display using the white LED which is suitable for the backlight of the liquid crystal display. More particularly, the present invention relates to a white LED, a backlight and a liquid crystal display using the white LED exhibiting a high luminance and an excellent color reproducing property due no less mixing of other emitting color lights with respect to blue, green and red color lights.

BACKGROUND ART

A light emitting diode (LED) is a semiconductor diode for radiating light, and has a function of converting an electrical energy into ultraviolet light or visible light. Particularly, for the purpose of utilizing the visible lights, there has been widely used a LED in which a light entitling chip formed of light emitting materials such as Gap, GaAsP, GaAlAs, GaN, InGaAlP or the like is sealed by a transparent resin. Further, there has been also widely used a display-type LED in which the light emitting material is fixed on an upper surface of a printed circuit board or a metal lead, and the fixed material is sealed by a resin case formed in a shape of numerical character or letter.

Further, when various phosphors are contained into a front surface of the light emitting chip or contained in the resin, it is also possible to suitably control the color of the emitted lights. That is, the LED can reproduce various lights in visible light region ranging from blue to red which is suitable for concrete use. Furthermore, since the light emitting diode (LED) is a semiconductor element, LED has a long life property and a high reliability, so that an exchanging frequency of LED due to failure is effectively decreased when the LED is used as a light source. Therefore, LED has been widely used as a constituting part of mobile communication devices, personal computer peripheral equipment, OA (office automation) devices, household electrical appliances, audiovisual apparatuses, various switches, various display devices such as light source display plate for backlight or the like.

However, in recent years, a sense of color of user utilizing the above various display devices has become highly upgraded, so that there has been technically demanded a function of capable of reproducing delicate color shade with a high resolution and a uniform external appearance of LED. In particular, LED for emitting white color light has grown in usage and popularity as a backlight for cellular phone or a lamp for automobile use, and demand of LED has been expected to greatly increased as an excellent substitute for fluorescent lamps. In this regard, in order to realize a high color-rendering property of the white light and the uniform external appearance of LED, various improvements have been tried.

Up to now, as LED for emitting white color light that have generally used or have been in trial run, there are two types of LEDs: LED which is formed by combining a blue luminescence diode (blue emission diode) with yellow luminescence phosphor (YAG), and If occasion demands, red phosphor (hereinafter referred to as "type 1"): and LED which is formed by combining a diode for emitting ultraviolet rays or ultraviolet lights with blue, yellow, red luminescence phosphors (hereinafter referred to as "type 2"). At the present stage, since the type 1 has a higher luminance than the type 2, the type 1 has been most widely used.

However, the type 1 has posed the .following drawbacks. Namely, the emitted light is liable to be recognized by user as yellowish light depending on a direction from which the user sees the emitted light, and unevenness of yellow color light and blue color light appear on a white surface when the emitted light is projected onto the white surface. Therefore, there may be a case where the light emitted from the white luminescence LED of type 1 is called as "pseudo-white light".

When the white color light is evaluated by an average color rendering index which indicates a quality of the white color light, the average color rendering index of the white luminance LED of type 1 remains at low range of 70 to 75 (70 or more 75 or less).

On the other hand, although the white luminance LED of the latter (type 2) is inferior to the former (type 1) in luminance, unevenness of the emitted light and the projected light is less than that of type 1, so that LED of type2 has solidified the front runner position of light source for illumination and backlight use. The LED of type2 has expected to be widely spread and further developments have been advanced.

As an example of the improvement in a direction which the development wants to head, there is reported a white luminance LED which is formed by combining: an ultraviolet luminance LED; europium-activated halo-phosphate phosphor or europium-activated aluminate phosphor; copper, aluminum-activated sine sulfide phosphor or europium, manganese-activated aluminate phosphor as green luminance phosphor; and europium-activated yttrium oxysulfide phosphor as red luminance phosphor (for example, refer to non-patent document 1).

As another example of the improvement, there is also reported a white luminance LED which is formed by combining: an ultraviolet luminance LED; europium-activated halo-phosphate phosphor or europium-activated aluminate phosphor; europium, manganese-activated aluminate phosphor as green luminance phosphor; and europium-activated lanthanum oxysulfide phosphor as red luminance phosphor (for example, refer to patent document 1), Although these white luminance LEDs have a high color rendering property and a high uniformity of the emitted lights that are inherent properties of the white LED of type 2, the luminance is still insufficient and further improvements are required. According to knowledge of the inventors of this invention, in order to attain both high color rendering property and high luminance in the white luminance LED of the above type 2, the following requirements must be fulfilled in a spectrum of the white light. Namely, the emitted lights having a wavelength of about 450 nm, 560 nm, and 620 nm at which respective peaks of color sensibilities for human person exist are contained in a well-balanced manner in the spectrum of the white light, and luminous efficiencies of the respective phosphors of blue (B), green (G) and red (R) luminance components are well balanced.

On the other hand, a liquid crystal display, which uses the above white LED (white luminance diode) as a backlight, has been widely used as a constituting part of mobile communication devices such as cellular phone, mobile phone or the like, OA (office automation) devices such as personal computer or the like, household electrical appliances, audiovisual apparatuses, various switches, various display devices such as light source display plate for backlight or the like.

These conventional liquid crystal displays are formed by combining a backlight using cold cathode fluorescent lamp (CCFL) with color filters, and have improved so as to attain a color reproduction range of about 70% or so in terms of international standard ratio (NTSC ratio). However, further improvement of the color reproduction range has been demanded. Further, since the cold cathode fluorescent lamp so be used as the light source contains harmful mercury, there has been seriously pointed out an adverse impact of the use of mercury on the environment.

Furthermore, in recent years, a blue LED (B-LED) and an LED capable of emitting an ultraviolet light have been developed and commercialized, and an LED lighting apparatus (illumination device) has actively developed. There are three types of LED lighting apparatuses: LED lighting apparatus (type 1) formed by combining B-LED (blue luminance diode) with yellow luminance phosphor; LED lighting apparatus (type 3) formed by mixing the respective lights emitted from R-LED (red luminance diode, G-LED (green luminance diode) and B-LED (blue luminance diode); and LED lighting apparatus (type 2) formed by combining UV-LED (ultraviolet ray emitting diode) with RGB phosphors.

LED lighting apparatuses of type 1 and type 3 have drawbacks such that the color reproducing property is poor and a control of the light color is difficult. Therefore, an expectation to realize LED lighting apparatuses of type 2 composed of UV-LED+RGB phosphors has been increased.

However, even if the white LED composed of UV-LED+RGB phosphors is applied to the backlight source, the color reproducing range was not sufficient. For example, when the white LED disclosed in the patent document 1 is applied to a liquid crystal display, a green color light other than blue color light is mixed into spectrum of a light transmitted through a blue color filter, and a blue color light is mixed into spectrum of a light transmitted through a green color filter. As a result, there is posed problem such that the color reproducing property is disadvantageously lowered.

Patent Document 1: Japanese Patent Application (Laid-Open) No. 2000-73052.

Non-Patent Document 1: Technical Journal of Mitsubishi Densen Kogyo (published July 2002, No. 99)

DISCLOSURE OF INVENTION

According to knowledge of the inventors of this invention, the following findings were obtained from series of developing history for actually realizing the conventional white LEDs of type 2. Namely, it became clear that there was a difference in a direction which the development wanted to head between the white LED used for lighting apparatus and the white LED used for backlight. That is, in a white LED used for lighting apparatus, it is important to realize a high luminance and a high average color rendering index (Ra) determining the quality of the white light. In contrast, in a white LED used for backlight, both the high luminance and a broad color reproducing range are technically demanded. In other words, although the high luminance is common property required for both the lighting apparatus and the backlight, the high average color rendering index and the broad color reproducing range are different depending on a specification required for the respective devices, and are not always compatible to each other.

Particularly in these years, in the white LED for liquid crystal television having a fast-growing market, the problem of environmental pollution, that has been a serious issue in the conventional cool cathode ray tube, would not occur. Further, there is some possibility of expanding the color reproduction range, so that an expectation to the technical development is extremely increased.

Under these circumstances, in the course of the development of the white LED of type 2 formed by combining ultraviolet ray emitting diode or violet luminance diode with three kinds or more of visible lights emitting phosphors, the inventors had found a desired luminance spectrum suitable for the white LED lamp as liquid crystal backlight, and found a combination of phosphors for realizing the luminance spectrum. The present invention had been achieved on the basis of the above findings.

Further, in a case where the conventional white LED was used as the backlight for the liquid crystal display, the white LED was incompatible with a color filter, so that other lights were mixed into the respective RGB lights thereby to deteriorate the color reproducing property. This is because the conventional white LED was widely used for not only the backlight for liquid crystal display but also a road traffic sign or the like, so that engineers paid attention only to emit the white light.

As the result of the researches eagerly conducted by the inventors of this invention, the inventors had found that an affinity (compatibility) of the RGB color filters with the light emitting wavelength of the white LED was very important, and the present invention had been achieved on the basis of the above finding.

The present invention has been achieved to solve the above conventional problems, and the present invention provides a white LED comprising: an ultraviolet emitting diode or a purple light emitting diode; and phosphors for emitting at least three visible lights including blue light, green light and red light; wherein a light spectrum of the white LED has: a first luminescence peak in a blue light region having a wavelength of 440-460 nm; a second luminescence peak in a green light region having a wavelength of 510-530 nm; and a third luminescence peak in a red light region having a wavelength of 620-640 nm.

Further, in the above white LED, it is preferable that each of the first to third luminescence peaks in the blue, green and red light regions has a half band width (FWHM: full width at half maximum) of 50 nm or less.

Furthermore, in the above white LED, it is also preferable that the phosphor for emitting blue light is an europium activated halo-phosphate phosphor expressed by a general formula 1: $(Sr_{1-x-y} Ba_x Ca_y Eu_z)_{10} (PO_4)_6 \cdot Cl_2$ in which x, y, z respectively satisfy the relations $x<0.2$, $y<0.1$ and $0.005<z<0.1$.

Further, in the above white LED, it is preferable that the phosphor for emitting green light is an europium and manganese activated aluminate phosphor expressed by a general formula 2: $(Ba_{1-x-y-z} Sr_x Ca_y Eu_z)(Mg_{1-u} Mn_u) Al_{10} O_{17}$ in which x, y, z, u respectively satisfy the relations $x<0.5$, $y<0.1$, $0.15<z<0.4$ and $0.3<u<0.6$.

Furthermore, in the above white LED, it is preferable that the phosphor for emitting red light is an europium activated lanthanum oxysulfide phosphor expressed by a general formula 3: $(La_{1-x-y} Eu_x M_y)_2 O_2 S$ in which M is at least one element selected from Sb and Sn, and x, y respectively satisfy the relations $0.01<x<0.15$ and $y<0.03$.

Further, in the above white LED, it is preferable that a luminescence intensity of the ultraviolet emitting diode or the purple light emitting diode has a peat value in a wavelength range of 360-410 nm.

Furthermore, the white LED of the present invention is suitable for a backlight and a liquid crystal display using the above white LED. Namely, the backlight of the present invention is characterized by comprising the above white LED.

Further, it is preferable that a light spectrum of the above white LED has: a first luminescence peak in a blue light region having a wavelength of 440-450 nm; and a second luminescence peak in a green light region having a wavelength of 510-530 nm, wherein each of the first to second luminescence peaks in the blue and green light regions has a half band width of 50 nm or less.

Further, the liquid crystal display of the present invention comprises: the above white LED; a backlight using the white LED; and color filters for filtering blue, green, red color lights, wherein: a percentage of a spectrum area composed of light components transmitted through the green color filter and having wavelengths of 400 to 500 nm with respect to a spectrum area composed of light components having wavelengths of 400 to 600 nm is 15% or less; and a percentage of a spectrum, area composed of light components having wavelengths of 400 to 550 nm with respect to the spectrum area composed of light components having wavelengths of 400 to 600 nm is 90% or more.

Furthermore, in the above liquid crystal display, it is preferable that a light emitting wavelength of the light emitting diode used in the white LED is 360 to 410 nm.

Further, in the above liquid crystal display, it is preferable that the spectrum of the lights transmitted the blue color filter comprises: a first peak top existing in a wavelength range of 440 to 450 nm; and a second peak top existing in a wavelength range of 510 to 530 nm; and a height of the second peak top is ½ or less of a height of the first peak top.

Furthermore, in the above liquid crystal display, it is preferable that a transmission factor (transmittance) at the blue color filter is 90% or less of a maximum transmission factor and a transmission factor at the green color filter is 95% or less of a maximum transmission factor when a light having wavelength of 500 nm is transmitted; and a transmission factor at the green color filter is 40% or less of a maximum transmission factor when a light having wavelength of 600 nm is transmitted.

The white LED of the present invention exhibits a high luminance and is excellent in color reproducing property. Further, according to the liquid crystal display of this invention, since the spectrum of the backlight using the white LED and the transmission spectrum of the color filters are suitably controlled, the liquid crystal display is excellent in color reproducing property. Therefore, all of the backlight and the liquid crystal display each using the white LED of the present invention can exhibit the high luminance and the excellent color reproducing property. In addition, unlike the conventional cold cathode fluorescent lamp (CCFL), there is no need to use harmful mercury, so that the problem of polluting environment would not occur.

BEST MODE FOR CARRYING OUT THE INVENTION

Figure 1:
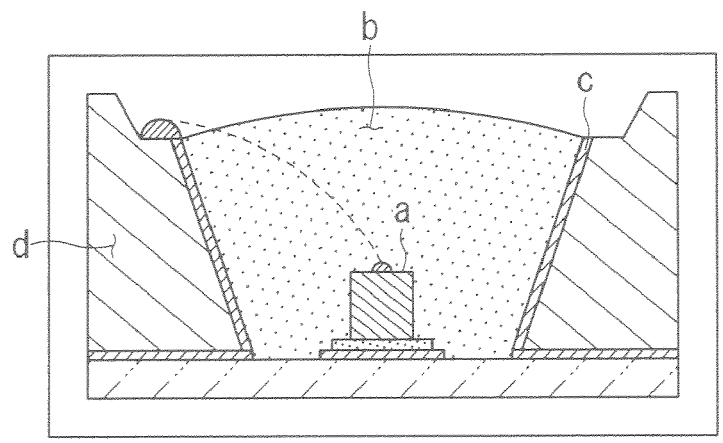
FIG. 1 is a sectional view schematically showing a structure of one embodiment of a white LED according to the present invention.

FIG. 1 is a sectional view schematically showing one embodiment of a white LED according to the present invention. The white LED shown in FIG. 1 comprises: a light emitting diode a; a phosphor layer b embedded in resin; a reflective layer c for reflecting and guiding the lights emitted from the above light emitting diode a and the phosphor layer b to outside; and a resin frame d for supporting an emission part. The white LED has a mechanism in which electrical energy applied to the LED lamp is converted by the light emitting diode a into ultraviolet light or purple light, and the converted lights are further converted into lights each having a longer wavelength by the phosphor layer b formed at an upper portion of the light emitting diode a, so that a white light, as a total, is radiated to outside the LED lamp.

As the ultraviolet light emitting diode or the purple light emitting diode, various light emitting diodes such as InGaN type, GaN type, AlGaN type diode or the like can be applied. Particularly, in a case where a light emitting diode having a light emitting peak value in a wavelength range of 360-420 nm is used and the light emitting diode is combined with a phosphor as described later, it becomes possible to configure a white LED exhibiting a high luminance and an excellent color reproducing property.

As the phosphor to be used for the above the phosphor layer b, it is important to adopt visible light emitting phosphor for radiating at least three kinds of lights including blue color, green color and red color lights. Concretely, there is used a phosphor having a light spectrum comprising three luminescence peaks, i.e., a first luminescence peak in a blue light region having a wavelength of 440-460 nm; a second luminescence peak in a green light region having a wavelength of 510-530 nm; and a third luminescence peak in a red light region having a wavelength of 620-640 nm.

In other words, when using: a blue luminance phosphor of which peak wavelength is existing in a range of 440-460 nm; a green luminance phosphor of which peak wavelength is existing in a range of 510-530 nm; a red luminance phosphor of which peak wavelength is existing in a range of 620-640 nm, three kinds of visible light emitting phosphors are used. In this connection, when two or more of phosphors for emitting the same color light are used, the number of kinds of visible light emitting phosphor is three or more as a total.

For example, in case of the white LED shown in FIG. 1, electrical energy applied to the light emitting diode a is converted by the light emitting diode a into ultraviolet light (or purple light), and the converted lights are further converted into lights each having a longer wavelength by the phosphor layer b formed at the upper portion of the light emitting diode a, so that a white light, as a total, is radiated to outside the LED.

In this regard, in the present invention, the ultraviolet light emitting diode or the purple light emitting diode is referred to as "light emitting diode", and the white light emitting diode as a finished product is referred to as "white LED".

Figure 2:
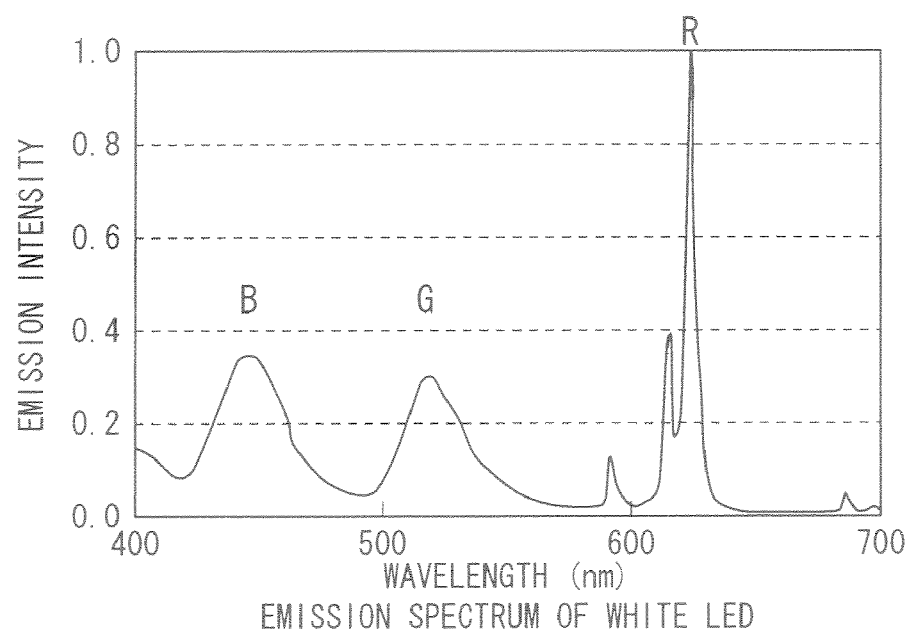
FIG. 2 is a graph schematically showing one example of an emission spectrum of the white LED according to the present invention.

FIG. 2 is a graph schematically showing one example of an emission spectrum of the white LED according to the present invention which is configured as shown in FIG. 1. Concretely, FIG. 2 shows an emission spectrum when the light emitting diode was excited by a current value of 20 mA thereby to radiate ultraviolet ray having a peak value at a wavelength of 400 nm and then the ultraviolet ray was converted by phosphor into a white light having a chromaticity of (0.253, 0.238). This emission spectrum is characterized in that the peak values are detected in a blue color region (B) at a wavelength of 447 nm, a green color region (G) at a wavelength of 518 nm and a red color region (R) at a wavelength of 623 nm, and a half band width of the respective peaks is 50 nm or less.

Figure 3:
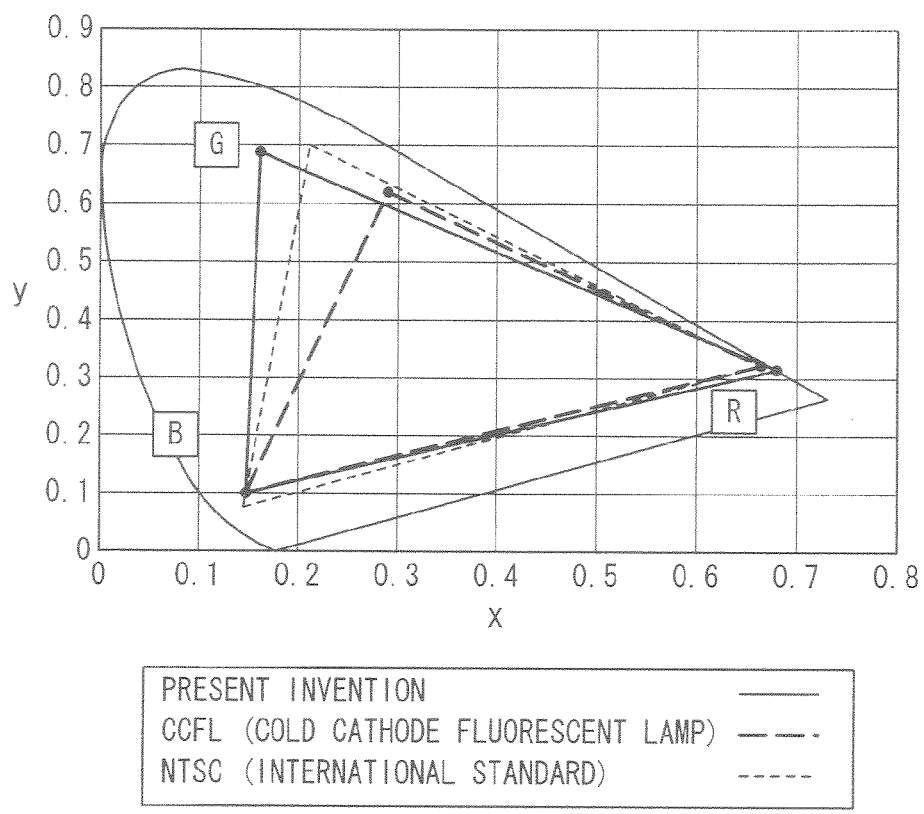
FIG. 3 is a graph schematically showing color reproduction range in a case where the white LED of the present invention is used as the backlight for the liquid crystal display compared with a case a current CCFL is used as the backlight for the liquid crystal display.

FIG. 3 is a graph in which emission colors of the lights transmitted through the general blue, green and red color filters are plotted in a CIE chromaticity diagram. That is, the lights emitted from the white LED according to the present invention are transmitted through the respective color filters that are generally used for a liquid crystal display (liquid crystal display device). The transmitted lights have the respective emission colors plotted in the CIE chromaticity diagram.

According to this CIE chromaticity diagram, the liquid crystal display means to able to display the lights having chromaticity falling within a triangular region obtained by connecting three emission points of blue color (B), green color (G) and red color (R).

That is, when an area of the triangular region in the above CIE chromaticity diagram is broader, the liquid crystal display can display more lights having various chromaticity. Thus, it can be said that the liquid crystal display (LCD) has a broad color reproduction range, and the LCD an excellent color reproducing property.

In FIG. 3, a color reproduction range of a liquid crystal display using the conventional cold cathode fluorescent lamp (CCFL) is also indicated by a thick broken line. However, it can be easily confirmed than the color reproduction range of the LCD of this invention is evidently broader than that of conventional one, so that the liquid crystal display of this invention can be confirmed to be excellent in color reproducing property.

In FIG. 3, there is also simultaneously indicated by a dotted line an international standard (NTSC) indicating an ideal triangular color reproduction range. An extent of the color reproduction range is usually expressed as a relative value obtained by calculating an area of the triangular region in the chromaticity diagram when the area of a triangular region specified by NTSC is assumed to be 100. On the basis of this definition, the color reproduction range of the liquid crystal display of this invention was 98, while that of the conventional liquid crystal display was 65.

Figure 4:
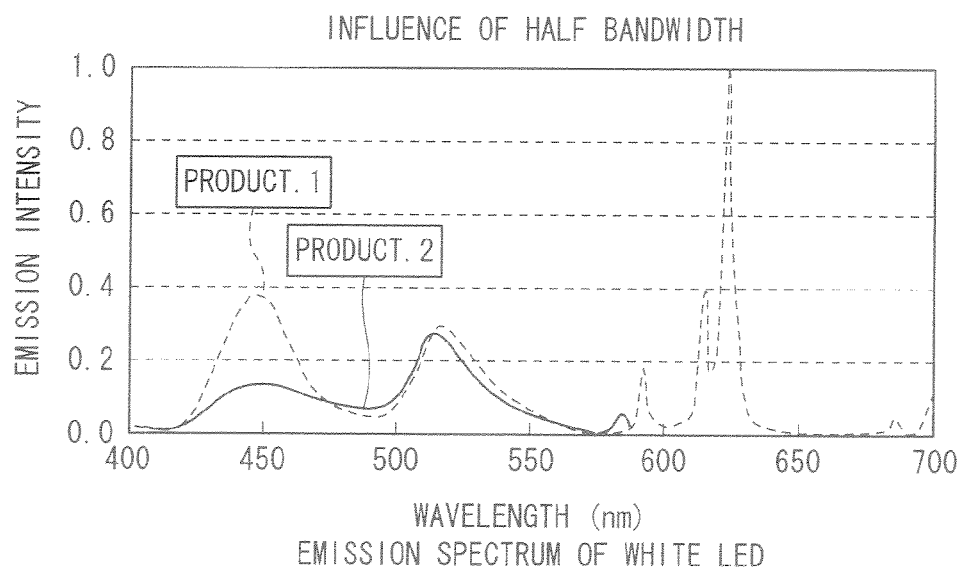
FIG. 4 is a graph schematically showing one example of an emission spectrum in a case where a half bandwidth of the emission spectrum peak is changed in the white LED of the present invention.

As previously described, it is preferable that a half bandwidth of the respective peak values of blue color region, green color region and red color region in the luminance spectrum of the white LED is 50 nm or less. For example, in the white LED obtained by combining B, G, R phosphors specified by the present invention, there were prepared: a white LED (product 1) in which the half bandwidths of peak values of B, G, R color lights are all 50 nm or less; and a white LED (product 2) in which a part of the half bandwidths of peak values of B, G, R color lights exceed 50 nm. FIG. 4 is a graph comparatively showing luminance spectrums in the white LEDs of one produces 1 and 2. Further, FIG. 5 is a graph showing the color reproduction ranges of the liquid crystal displays using the white LEDs according to the products 1 and 2.

Figure 5:
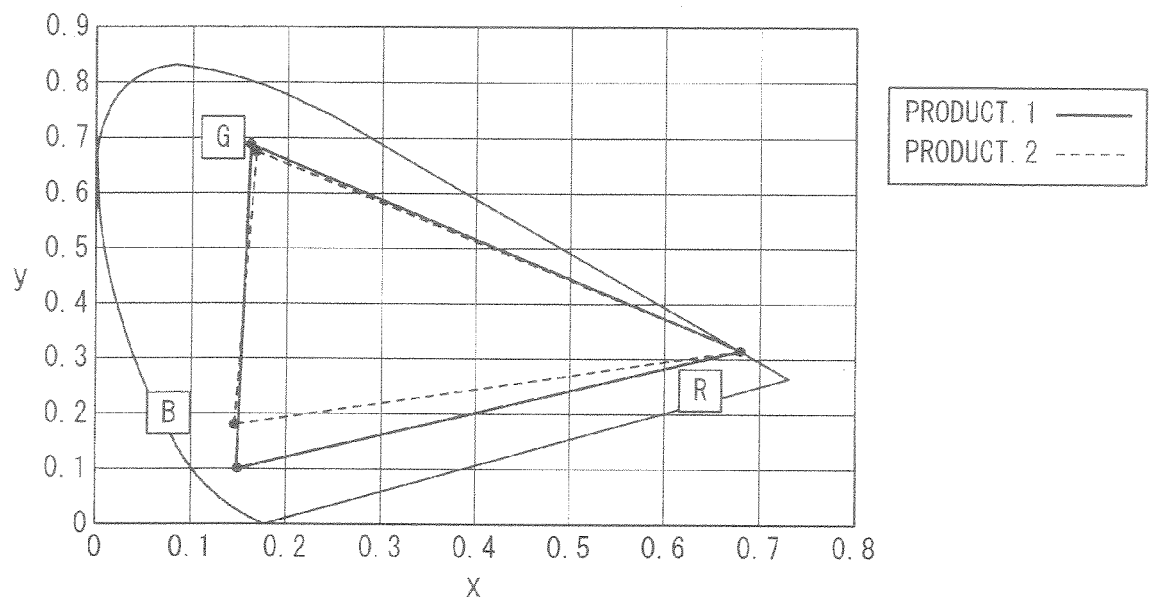
FIG. 5 is a graph comparatively showing color reproduction ranges in a case where the white LEDs of the present invention each having emission spectrums shown in FIG. 4 are used as the backlights for the respective liquid crystal displays.

As is clear from the results shown in FIG. 4 and FIG. 5, the color reproduction range of the liquid crystal display according to the product 1 was 98 based on a standard of NTSC shown in FIG. 3, while that of product 2 was 87. Although the color reproduction range of the product 2 is more excellent than that of the cool cathode fluorescent lamp, the color reproduction range of the product 2 is inferior to that of the product 1. The reason is that the spectrum in product 2 has peak values in a blue color region at a wavelength of 447 nm, a green color region at a wavelength of 518 nm and a red color region at a wavelength of 623 nm as specified in the present invention, however, the half band width of the blue color peak is excessively broad to be 60 nm thereby to deteriorate a purity of the blue color component.

In this connection, it is most preferable that all of the respective peaks is 50 nm or less. However, if a maximum value of the half bandwidth is 80 nm or less, such width is suitable for practical use. In particular, if the half band width of only one peak of blue color, green color or and red color is 80 nm and the half band widths of remaining two color peaks are 50 nm or less, the color reproduction range can attain to 80 or more with respect to NTSC. Accordingly, the half bandwidths of the respective peaks are preferably set to 80 nm or less, more preferably to 50 nm or less.

As described above, when the phosphors comprising: a luminescence peak in a blue light region having a wavelength of 440-460 nm; a luminescence peak in a green light region having a wavelength of 510-530 nm; and a third luminescence peak in a red light region having a wavelength of 620-640 nm are used, and the half band widths of the respective luminescence peaks are 70 nm or less, preferably 50 nm or less, there can be formed a white LED having a high luminance and an excellent color reproducing property.

Next, the phosphor will be explained. As far as the phosphor comprises the above characteristics, a composition thereof is not particularly limited. However, preferable examples of the phosphors can be listed hereunder.

As the phosphor for emitting blue color light, there can be listed an europium activated halo-phosphate phosphor expressed by a general formula 1: $(Sr_{1-x-y} Ba_x Ca_y Eu_z)_{10} (PO_4)_6 \cdot Cl_2$ in which x, y, z respectively satisfy the relations $x<0.2$, $y<0.1$ and $0.005<z<0.1$. In the above general formula 1, x value and y value may include 0 (zero). As described later, in order to make a shape of a luminescence peak sharp, it is preferable to set the x value and the y value to close to 0 (including zero).

Further, as the phosphor for emitting green color light, there can be listed an europium and manganese activated aluminate phosphor expressed by a general formula 2: $(Ba_{1-x-y-z} Sr_x Ca_y Eu_z)(Mg_{1-u} Mn_u)Al_{10}O_{17}$ in which x, y, z, u respectively satisfy the relations $x<0.5$, $y<0.1$, $0.15<z<0.4$ and $0.3<u<0.6$. In the above general formula 2, x value and y value may include 0 (zero).

Furthermore, as the phosphor for emitting red color light, there can be listed an europium activated lanthanum oxysulfide phosphor expressed by a general formula 3: $(La_{1-x-y} Eu_x M_y)_2 O_2 S$ in which M is at least one element selected from Sb and Sn, and x, y respectively satisfy the relations $0.01<x<0.15$, and $y<0.03$. In the above general formula 3, y value may include 0 (zero).

Although an average grain size of the phosphor is not particularly limited. However, the average grain size of the phosphor is preferably set to 3 µm or more. When a grain size of the phosphor is large enough to have the average grain size of 3 µm or more, a high luminance property can be easily obtained. An upper limit of the average grain size of the phosphor is not particularly limited. However, the upper limit is appropriately determined so as to meet a structure of the white LED. However, the grain sizes of the phosphors are excessively large, the phosphors are not easily mixed uniformly. Therefore, the upper limit of the average grain size of the phosphor is preferably set to 60 µm or less.

Further, a mixing ratio of the respective phosphors is arbitral as far as the mixing ratio can realizes an aimed chromaticity of the resultant light. However, in general, in order to obtain a good white LED, it is preferable to mix 15-25 mass % of blue light phosphor with 15-25 mass % of green light phosphor and a balance of red light phosphor thereby to prepare 100 mass % in total of a mixture including blue, green, red color light phosphors.

A method of manufacturing the phosphor layer in the white LED is not particularly limited. However, for example, there can be adopted a method comprising the steps of: mixing each of phosphor powders with a suitable resin to prepare some kinds of mixtures; and mixing the some kinds of mixtures to prepare a final phosphor mixture including the phosphors and resins. In addition, there can be also adopted a method comprising the steps of: mixing each of phosphor powders for emitting the respective color lights to prepare a phosphor mixture; and mixing the phosphor mixture with resin to prepare a final phosphor mixture including the phosphors and resins.

Thus prepared the phosphor mixture is coated on the light emitting diode and subsequently the resin is set whereby a white LED can be formed. In this regard, the structure of a substrate to be used in the white LED or a metal frame or the like is arbitrarily configured.

Since the white LED according to the present invention can maintain a high luminance and is excellent in color reproducing property, the white LED is effective as a backlight of the liquid crystal display used in various display devices such as mobile communication devices including cellular phone and mobile phone, personal computer peripheral equipment, OA (office automation) devices, household electrical appliances, audiovisual apparatuses, various switches, light source display plate for backlight or the like. The liquid crystal display using the white LED can obtain a high luminance property and an excellent color reproducing property. In addition, when the white LED is used as a backlight, a plurality of the white LEDs may be combined so as to form the backlight. For example, four pieces of the white LEDs may be arranged to form a rectangular shape.

Further, the liquid crystal display of the present invention can be applied to various driving systems such as simple-matrix system, active matrix system, static system or the like, various kinds of liquid crystals such as TN, STN, TSTN or the like, various display systems such as ASM mode, OCB mode, homogeneous-to-twisted planer mode, RFFMH mode, patterned vertical alignment mode, IPS mode or the like. Furthermore, the liquid crystal display of the present invention can be also applied to various display systems such as a liquid crystal display requiring a backlight, for example, a transmission type liquid crystal display, a semi-transmission type liquid crystal display or the like.

The liquid crystal display is configured by mainly comprising: a backlight portion for supplying lights to a liquid crystal shutter portion; the liquid crystal shutter portion for adjusting an intensity of a transmitted light by an applied voltage; and a color filter portion for displaying colors. If necessary, there may be provided other members such as diffusing sheet, lens sheet, polarizing sheet, phase differential sheet, reflector (reflecting sheet) or the like that have functions for correcting uniformity of the light, light distributing property, phase difference or the like. Further, as the backlight portion, either backside-light source system or side-light system can be adopted.

According to the knowledge of the inventors of this invention, it has been confirmed that the color reproducing property of a liquid crystal display depends heavily on characteristics of the color filter portion and the backlight portion among the above various constitutional elements.

The liquid crystal display of the present invention is characterized by comprising: a backlight using a white LED; and color filters for filtering blue, green, red color lights, wherein: a percentage of a spectrum area composed of light components having been transmitted the green color filter and having wavelengths of 400 to 500 nm with respect to a spectrum area composed of light components having wavelengths of 400 to 600 nm is 15% or less; and a percentage of a spectrum area composed of light components having wavelengths of 400 to 550 nm with respect to the spectrum area composed of light components having wavelengths of 400 to 600 nm is 90% or more.

Namely, in the present invention, an attention is particularly paid to a light transmitted through the green color filter. The reason to pay attention is as follows. That is, in a case where three kinds of phosphors for emitting blue, green, red color lights are used, the peak wavelengths for the respective colors are revealed in an emission spectrum in an order of blue color, green color, red color from a shorter wavelength region. Since the green color peak wavelength is formed between the blue color peak wavelength and the red color peak wavelength, the green color peak wavelength is easily affected by both the blue color light and the red color light.

Accordingly, when a shape of spectrum of the light transmitted through the green color light filter is improved, it becomes possible to mitigate the adverse influences of the blue color light and the red color light. As a result, the inventors had found that a liquid crystal display having an excellent color reproducing property could be obtained. Further, when the following requirements were fulfilled, the present invention had been achieved.

A first requirement is that a percentage of a spectrum area composed of light components having been transmitted the green color filter and having wavelengths of 400 to 500 nm with respect to a spectrum area composed of light components having wavelengths of 400 to 600 nm is 15% or less. In this regard, "light transmitted the green color filter" means a light after transmitting through the green color light filter on which the light radiated from a backlight is projected when the liquid crystal display is turned on. Furthermore, the respective spectrum areas composed of light components are calculated and obtained by an equation: $\int Ig(\lambda) d\lambda$ wherein the light intensity is $Ig(\lambda)$.

Concretely, with respect to the lights transmitted through the green color filter, when a spectrum area (area 1) within the wavelength range of 400-500 nm and a spectrum area (area 2) within the wavelength range of 400-600 nm are measured, an area ratio A calculated by an equation: (area 1/area 2)×100 (%) is required to be 15% or less. Setting the above area ratio A to 15% or less means that the peak wavelengths of the green lights as a whole stay within the wavelength range of 500-600 nm. According to this feature, other color lights are hardly affected by the blue color light wavelength, so that the color rendering property can be improved. Preferably, the above area ratio A is 10% or less.

A second requirement is that a percentage of a spectrum area composed of light components having been transmitted the green color filter and having wavelengths of 400 to 550 nm with respect to a spectrum area composed of light components having wavelengths of 400 to 600 nm is 90% or more.

Concretely, as is the same manner as above, with respect to the lights transmitted through the green color filter, when a spectrum area (area 3) within the wavelength range of 400-550 nm and a spectrum area (area 4) within the wavelength range of 400-600 nm are measured, an area ratio B calculated by an equation: (area 3/area 4)×100(%) is required to be 90% or more. Setting the above area ratio B to 90% or more means that the peak wavelengths of the green lights as a whole stay within the wavelength range of 400-550 nm. According to this feature, other color lights are hardly affected by the red (or yellow) color light wavelength, so that the color rendering property can be improved. Preferably, the above area ratio B is 91% or more.

In the present invention, if either one of above the first requirement or the second requirement is satisfied, the color rendering property can be improved. However, when both of the first requirement and the second requirement are satisfied, it becomes possible to effectively mitigate the influences of both the blue color wavelength and the red color (or yellow color) wavelength, thus being a more preferable feature.

When the above area ratio A is decreased at an amount of 1%, an NTSC ratio indicating the color reproduction range is increased about three times. On the other hand, when the above area ratio B is increased at an amount of 1%, the NTSC ratio is increased about six times. When a current cool cathode fluorescent lamp is used as a light source, the NTSC ratio is about 70 or so. Therefore, it was confirmed to be extremely effective to appropriately control the above area ratio for the purpose of broadening the color reproduction range.

Further, it is preferable that the spectrum of the lights transmitted through the blue color filter comprises: a first peak existing in a wavelength range of 440 to 450 nm; and a second peak existing in a wavelength range of 510 to 530 nm; and a height (b2) of the second peak is ½ or less of a height (b1) of the first peak. In this connection, "light transmitted through the blue color filter" means a light after transmitting through the blue color light filter on which the light radiated from a backlight is projected when the liquid crystal display is turned on.

In the light transmitted through the blue color filter, a ratio (b2/b1) of the second peak height (b2)/the first peak height (b1) being ½ or less means that the blue color light is hardly affected by the green color light wavelength when the blue light is displayed. That is, the blue color light is purified so as to include less amount of green color light components, so that the color reproducing property can be improved. The ratio (b2/b1) of the second peak height (b2)/the first peak height (b1) is preferably set to ⅓ or less.

Furthermore, it is preferable that a transmission factor (transmittance) at the blue color filter is 90% or less of a maximum transmission factor and a transmission factor at the green color filter is 95% or less of a maximum transmission factor when a light having wavelength of 500 nm is transmitted; and a transmission factor at the green color filter is 40% or less of a maximum transmission factor when a light having wavelength of 600 nm is transmitted. In this regard, the maximum transmission factor is defined as the largest transmission factor when a light having wavelength of 400-700 nm is transmitted.

The feature of the transmission factor at the blue color filter being 90% or less of a maximum transmission factor when a light having wavelength of 500 nm being transmitted indicates that a peak shape of the blue color light is sharp. In the same manner, the feature of the transmission factor at the green color filter being 95% or less of the maximum transmission factor; and the transmission factor at the green color filter being 40% or less of a maximum transmission factor when a light having wavelength of 600 nm being transmitted indicates that a peak shape of the green color light is sharp. The feature of the peak shape being sharp indicates that a wavelength range, at which the blue color light and the green color light are mixed, is narrow. Therefore, the light having the sharp peak is hardly affected by other color lights, thus resulting in a further improvement of the color reproducing property.

According to the above structure, a liquid crystal display excellent in a color reproducing property can be obtained. In order to obtain the above characteristics, it is necessary to suitably control compatibility between the white LED and the RGB color filters. As a measure for controlling the color filter, there can be adopted various measures. Concretely, a measure to suitably set a position or a width of transmission window by selecting a pigment; a measure to increase a concentration of the pigment; and a measure to control a thickness of the color filter film; or the like are effective.

A method of manufacturing the color filter is not particularly limited. However, one example of the method in which a pigment dispersion method is applied to a black matrix having a metal chromium (Cr) layer will be described hereunder.

That is, the method comprises the steps of: providing a resist layer onto the Cr layer formed on a glass substrate by a sputtering method or the like; forming a pattern by using a photo exposing technique; performing an etching work; and peeling the resist layer thereby to provide a black matrix having a predetermined structure.

Next, a photo-sensitive color resist containing a multi-functional monomer as photo-induced polymerization component and a polymerization initiating catalyst is coated. Then, the coated color resist is exposed to a light and developed by utilizing an alkaline solution. These series of operation are repeated for the respective color layers thereby to form coloring layers having an entire set of RGB. Thereafter, an overcoat layer is provided, and if necessary, an ITO layer and a photo spacer are provided whereby the color filters can be manufactured.

The above color resist in case of the photo-sensitive color resist can be constituted by: the multi-functional monomer as photo-induced polymerization component and a polymerization initiating catalyst; a dispersing agent for uniformly dispersing the pigment; a leveling agent for making a film thickness uniform; and an organic solvent in addition to a coloring agent and a binder resin.

As the above coloring agent, there can be used various coloring agents such as organic pigment, inorganic pigment, dye or the like. However, a coloring agent excellent in a heat resistance and a light resisting property is preferable. For example, there can be used various pigments such as azo-chelate type, condensated azo type, pnthalocyanine type, benzo-imidazolone type, quinacridone type, iso-indolynine type, pyransulone type, anthrax-pyrimidine type, dibrom-anthansulone type, indanthrone type, franthrone type, perilene type, perinone type, quino phtharone type, thio-indigo type, dioxadine type, anthraquinone type, pyrolo-pyrol type or the like.

More concretely, the pigments indicated by the following color index (C.I.) numbers are suitably used.

C.I. yellow pigments No: 20, 24, 83, 86, 93, 109, 110, 117, 125, 137, 138, 139, 147, 148, 150, 153, 154, 166 and 168.

C.I. red pigments No: 9, 97, 122, 123, 149, 168, 177, 180, 192, 208, 215, 216, 217, 220, 223, 224, 226, 227, 228, 240 and 254.

C.I. purple pigments No: 19, 23, 29, 30, 37, 40 and 50.

C.I. blue pigments No: 15, 15:1-6, 22, 60 and 64.

C.I. green pigments No: 7 and 36.

When a kind, an addition amount and a mixing ratio of the above pigment are controlled, the light transmission factor can be adjusted in accordance with the color to be aimed.

By the way, when the color filter is manufactured in accordance with the pigment dispersion method, it is suitable to use a colored and photo-induced polymerization type resin constituted by a binder resin, ethylene type unsaturated compound, photo-induced polymerization initiating agent and the pigment.

As the above binder resin, it is preferable to use a polymer material which is colorless and transparent, and having an excellent heat resistance and a light resisting property. Concretely, the examples of the binder resin may include: for example, an epoxy resin, melamine resin, acryl resin, polyimide resin, polyamic resin, polyester resin, unsaturated polyester resin, polycarbonate resin, photo-sensitive monomer and oligomer having a (meta) acryloyl group or the like.

The examples of the ethylene type unsaturated compound may include: for example, monovalent or multivalent monomers such as styrene, (meta) methyl acrylate, (meta) ethyl acrylate, (meta) n-propyl acrylate, (meta) isopropyl acrylate, (meta) n-butyl acrylate, (meta) SEC-butyl acrylate, (meta) tert-butyl acrylate, (meta) isobutyl acrylate, (meta) n-pentyl acrylate, methyl styrene, hydroxyethyl, (meta) acrylate, ethylene glycol, dimeta-acrylate, penta-erythritol tri-(meta) acrylate or the like; and normal photo-induced polymerization type resin such as polyester (meta) acrylate, polyurethane (meta) acrylate, epoxy (meta) acrylate, or the like.

As the photo-induced polymerization initiating agent (starter), there can be suitably used, for example, α-aminoacetophenone, anthraquinone, benzoyl ethylether, benzil, benzophenone, 4,4'-bisdimethyl amino benzophenone, 4,4'-bistrichloromethyl benzophenone, dibutyl phenyl phosphine, α, α'-diethoxy acetophenone, 2-ethyl anthraquinone, benzoyl bisphenyl, chlorobenzophenone, benzoin, benzoin methyl ether, benzoin isobutyl ether, anthraquinone thioxanthone, methyl orthobenzoil benzoic acid, paradimethyl aminoacetophenone or the like.

A backlight is manufactured by using the white LED according to the present invention having a structure shown in FIG. 1. Concretely, at a time of assembling the white LED into a backlight, a plurality of the white LEDs required for obtaining a predetermined surface luminance and luminous flux amount are arranged on a plain surface, or the white LEDs are disposed to four sides of a backlight casing whereby it becomes possible to obtain the backlight according to the present invention.

As previously described, it is preferable to provide a reflection sheet (a reflecting layer) to a bottom surface or a side surface of the backlight casing. The reflection sheet has a function of reflecting the light, which is emitted from the white LED and radiated in directions of a rear surface and a side surface of the backlight casing, to a direction of a backlight surface. As the above reflection sheet, there can be used: a sheet of which front surface is worked to be a mirror surface formed by depositing metals such as aluminum (Al) or gold (Au); or a sheet to which a resin having a high light-reflecting property is integrally molded.

Further, it is necessary to control the light to be uniform so as not to cause any distribution of luminosity on a liquid crystal display panel. Therefore, a light guiding plate and a light diffusing sheet can be used. The diffusing sheet is formed by providing a means for diffusing the light to a sheet composed of transparent resin material. In this connection, the means for diffusing the light may be also formed: by mixing a light diffusing substance into the sheet; or formed by mixing micro-substances having different refractive index into the sheet; or formed by coarsening a surface of the sheet; or formed by providing a film composed of a light diffusing substance onto the sheet surface. Further, it is also possible to appropriately use a prism sheet or the like having a function of converging the light to a particular direction in place of the above light diffusing sheet, or it is also possible to use the prism sheet or the like together with the light diffusing sheet.

In the present invention, it is preferable that an emission wavelength of the light emitting diode used in the white LED is within a range of 360-410 nm. If the emission wavelength is within she range of 360-410 nm, the white light emission spectrum is easily controlled by combining the aforementioned phosphors. A preferable emission wavelength of the light emitting diode is within a range of 370-410 nm. As the wavelength is shortened, although a light absorbing efficiency and luminous efficiency of the red emission phosphor are improved, a luminous efficiency of the light emitting diode chip per se is disadvantageously lowered, so that the shortening of the wavelength does not always contribute to improve the luminance. In addition, there are revealed harmful effects such that deteriorations of the phosphor layer b, resin and optical parts become marked and so on. On the other hand, as the wavelength is prolonged, the luminous efficiency of not only the red emission phosphor but also overall phosphors is lowered thereby to deteriorate the luminance.

Further, the phosphor layer of the white LED is formed by hardening the powders of blue, green, red emission phosphors by a resin. As the respective phosphors, it is preferable to use phosphors of which light spectrum has: a luminescence peak in a blue light region having a wavelength of 440-460 nm; a luminescence peak in a green light region having a wavelength of 510-530 nm; and a luminescence peak in a red light region having a wavelength of 620-640 nm. Namely, it is preferable to use the blue emission phosphor having a peak wavelength of 440-460 nm; the green emission phosphor having a peak wavelength of 510-530 nm; and the red emission phosphor having a peak wavelength of 620-640 nm, respectively.

As the phosphors having the above emission characteristics, as previously described, there can be suitably used: a blue emission phosphor having a composition expressed by the general formula 1 $(Sr_{1-x-y} Ba_x Ca_y Eu_z)_{10} (PO_4)_6 \cdot Cl_2$; a green emission phosphor having a composition expressed by a general formula 2 $(Ba_{1-x-y-z} Sr_x Ca_y Eu_z)(Mg_{1-u} Mn_u) Al_{10} O_{17}$; and a red emission phosphor having a composition expressed by a general formula 3: $(La_{1-x-y} Eu_x M_y)_2 O_2 S$.

Note, in the above general formulae 1-2, the values of x and y may include 0 (zero). Further, in the above general formula 3, a part of La is substituted by Eu, and a part of La is further substituted by M elements such as Sb, Sn, Sm or the like. These substituting elements M would not change the peak wavelength in the emission spectrum and a half bandwidth of the peak. However, there is a tendency that a grain size of the phosphor is increased whereby the grain is liable to easily settled down in slurry of the phosphor while there is also a tendency that the luminance can be improved. The grain size of the phosphor is set to 80 μm or less, preferably to 60 μm or less.

Further, it is preferable that the light emission spectrum of the white LED has: a luminescence peak in a blue light region having a wavelength of 440-460 nm; and a luminescence peak in a green light region having a wavelength of 510-530 nm; and each of the luminescence peaks has a half band width of 50 nm or less.

When the half band widths of the peak wave forms in the blue light region and the green light region are 50 nm or less, there can be provided a light which is emitted from the white LED and having been mixed with less amount of blue and green lights. In addition, it is more preferable that a half bandwidth of a peak waveform existing in the red light region having a wavelength of 620-640 nm is also 50 nm or less. The above white LED can be realized by using the phosphors described above.

As explained above, in the liquid crystal display according to the present invention, since the compatibility between the emission spectrum of the white LED and the color filter is suitably controlled, the color reproducing property of the display is excellent. Therefore, this liquid crystal display can be widely applied to various products including mobile communication devices such as cellular phone, mobile phone or the like, OA (office automation) devices such as personal computer or the like, household electrical appliances, audio-visual apparatuses, various switches, various display devices such as light source display plate for backlight or the like.

EMBODIMENT

Next, a concrete embodiment of the white LED according to the present invention will be explained and illustrated in more detail with reference to the attached drawings.

The white LED according to this embodiment adopted a structure of which cross section was shown in FIG. 1. An evaluation of the white LED was performed in accordance with the following manners. That is, emission chips each having a 300 μm square were arranged to a display casing as the respective light emitting diodes. Then, an electric current of 60 mA was passed through the emission chips thereby to emit lights. The emitted lights were transmitted through blue, green and red color filters that were generally used for a liquid crystal display. Then, the transmitted lights were introduced into an integrating sphere where the respective emission colors of blue, green and red of the lights were measured.

As a result, the color reproduction ranges (color reproducing property) of the respective lights were evaluated under a condition that light emitting device was assembled into a display. In this regard, the color reproducing property was calculated as an area ratio with respect to the ideal color reproduction range prescribed by the International Standard (NTSC) as already explained hereinbefore. Further, a luminance of the white LED was evaluated with respect to the light which was not transmitted through the color filter.

The above color reproducing property was evaluated by using a compact array spectrometer (CAS 140; manufactured by Systems Corporation) while the luminance of the white LED was evaluated by using an MCPD apparatus (manufactured by Ootsuka Electron Corporation).

<Method of Manufacturing LED Lamp>

Each of three kinds or more of phosphor powders was separately blended with silicone resin so that the weight ratio of the phosphor was controlled to be 30 mass %, thereby to prepare the respective slurries of the phosphors. Next, the respective slurries of the phosphors were blended so that a chromaticity of the LED lamp in an coordinate was fallen within the ranges of x and y values (x=0.250-0.255, y=0.235-0.240) thereby to prepare a blended slurry. A part of thus obtained blended-slurry was taken out and dropped on the LED arranged as shown in FIG. 1. Then, the dropped slurry was subjected to a heat treatment at a temperature of 100-150° C. and the silicone resin was hardened or cured thereby to manufacture a white LED lamp.

Embodiment of the white LED lamp will be explained more concretely with reference to the following Examples and Comparative Examples. In the following Examples and Comparative Examples, as the light emitting diode, an emission diode having an emission peak value at wavelength of 399 nm was used.

EXAMPLE 1

There were prepared: an europium activated alkaline earth chloro-phosphate phosphor having a composition of $(Sr_{0.99} Eu_{0.01})_{10} (PO_4)_6 \cdot Cl_2$ as blue emission phosphor; an europium and manganese activated aluminate phosphor having a composition of $(Ba_{0.726} Eu_{0.274}) (Mg_{0.55} Mn_{0.45}) Al_{10} O_{17}$ as green emission phosphor; and an europium activated lanthanum oxysulfide phosphor having a composition of $(La_{0.833} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.1%, 19.5% and 60.4% (mass %) thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 1.

EXAMPLE 2

There were prepared: an europium activated alkaline earth chloro-phosphate phosphor having a composition of $(Sr_{0.97} Ca_{0.02} Eu_{0.01})_{10} (PO_4)_6 \cdot Cl_2$ as blue emission phosphor; an europium and manganese activated aluminate phosphor having a composition of $(Ba_{0.726} Eu_{0.274}) (Mg_{0.50} Mn_{050}) Al_{10} O_{17}$ as green emission phosphor; and an europium activated lanthanum oxysulfide phosphor having a composition of $(La_{0.834} Sb_{0.001} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 19.0%, 19.0% and 62.0% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 2.

EXAMPLE 3

There were prepared: an europium activated alkaline earth chloro-phosphate phosphor having a composition of $(Sr_{0.99} Eu_{0.01})_{10} (PO_4)_6 \cdot Cl_2$ as blue emission phosphor; an europium and manganese activated aluminate phosphor having a composition of $(Ba_{0.25} Sr_{0.475} Eu_{0.275}) (Mg_{0.55} Mn_{0.45}) Al_{10} O_{17}$ as green emission phosphor; and an europium activated lanthanum oxysulfide phosphor having a composition of $(La_{0.883} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.2%, 19.0% and 60.8% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 3.

EXAMPLE 4

There were prepared: an europium activated alkaline earth chloro-phosphate phosphor having a composition of $(Sr_{0.75} Ba_{0.23} Ca_{0.01} Eu_{0.01})_{10} (PO_4)_6 . Cl_2$ as blue emission phosphor; an europium and manganese activated aluminate phosphor having a composition of $(Ba_{0.756} Eu_{0.274}) (Mg_{0.55} Mn_{0.45}) Al_{10} O_{17}$ as green emission phosphor; and an europium activated lanthanum oxysulfide phosphor having a composition of $(La_{0.883} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.1%, 19.5% and 60.4% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 4.

EXAMPLE 5

There were prepared: an europium activated alkaline earth chloro-phosphate phosphor having a composition of $(Sr_{0.98} Eu_{0.02})_{10} (PO_4)_6 . Cl_2$ as blue emission phosphor; an europium and manganese activated aluminate phosphor having a composition of $(Ba_{0.756} Eu_{0.274}) (Mg_{0.60} Mn_{0.40}) Al_{10} O_{17}$ as green emission phosphor; and an europium activated lanthanum oxysulfide phosphor having a composition of $(La_{0.883} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.3%, 19.8% and 59.9% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 5.

EXAMPLE 6

There were prepared: an europium activated alkaline earth chloro-phosphate phosphor having a composition of $(Sr_{0.97} Ca_{0.02} Eu_{0.01})_{10} (PO_4)_6 . Cl_2$ as blue emission phosphor; an europium and manganese activated aluminate phosphor having a composition of $(Ba_{0.35} Sr_{0.375} Eu_{0.275}) (Mg_{0.55} Mn_{0.45}) Al_{10} O_{17}$ as green emission phosphor; and an europium activated lanthanum oxysulfide phosphor having a composition of $(La_{0.884} Sb_{0.001} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.0%, 20.0% and 60.0% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 6.

EXAMPLE 7

There were prepared: an europium activated alkaline earth chloro-phosphate phosphor having a composition of $(Sr_{0.99} Eu_{0.01})_{10} (PO_4)_6 . Cl_2$ as blue emission phosphor; an europium and manganese activated aluminate phosphor having a composition of $(Ba_{0.75} Eu_{0.25}) (Mg_{0.55} Mn_{0.45}) Al_{10} O_{17}$ as green emission phosphor; and an europium activated lanthanum oxysulfide phosphor having a composition of $(La_{0.883} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.2%, 19.9% and 59.9% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 7.

EXAMPLE 8

There were prepared: an europium activated alkaline earth chloro-phosphate phosphor having a composition of $(Sr_{0.99} Eu_{0.01})_{10} (PO_4)_6 . Cl_2$ as blue emission phosphor; an europium and manganese activated aluminate phosphor having a composition of $(Ba_{0.726} Eu_{0.274}) (Mg_{0.55} Mn_{0.45}) Al_{10} O_{17}$ as green emission phosphor; and an europium activated lanthanum oxysulfide phosphor having a composition of $(La_{0.883} Sb_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 20.5%, 20.1% and 59.4% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 8.

EXAMPLE 9

There were prepared: an europium activated alkaline earth chloro-phosphate phosphor having a composition of $(Sr_{0.97} Eu_{0.03})_{10} (PO_4)_6 . Cl_2$ as blue emission phosphor; an europium and manganese activated aluminate phosphor having a composition of $(Ba_{0.75} Eu_{0.25}) (Mg_{0.55} Mn_{0.45}) Al_{10} O_{17}$ as green emission phosphor; and an europium activated lanthanum oxysulfide phosphor having a composition of $(La_{0.883} Sn_{0.002} Eu_{0.115})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 19.5%, 20.0% and 60.5% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 9.

EXAMPLE 10

There were prepared: an europium activated alkaline earth chloro-phosphate phosphor having a composition of $(Sr_{0.99} Eu_{0.01})_{10} (PO_4)_6.Cl_2$ as blue emission phosphor; an europium and manganese activated aluminate phosphor having a composition of $(Ba_{0.726} Eu_{0.274}) (Mg_{0/55} Mn_{0.45}) Al_{10} O_{17}$ as green emission phosphor; and an europium activated lanthanum oxysulfide phosphor having a composition of $(La_{0.882} Sb_{0.003} Eu_{0.115})_2 O_2 S$ as red emission phosphor.

Each of three Kinds of phosphors was mixed with silicone resin so that a concentration of the phosphor was 30 mass % thereby to prepare three kinds of phosphor slurries. Then, the respective phosphor slurries were blended at amounts of 19.6%, 19.8% and 69.6% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Example 10.

COMPARATIVE EXAMPLE 1

There were prepared: an europium activated alkaline earth chloro-phosphate phosphor having a composition of $(Sr_{0.59} Ba_{0.39} Ca_{0.01} Eu_{0.01})_{10} (PO_4)_6.Cl_2$ as blue emission phosphor; a copper and aluminum activated zinc sulfide phosphor having a composition of ZnS: Cu, Al as green emission phosphor; and an europium activated yttrium oxysulfide phosphor having a composition of $(Y_{0.94} Eu_{0.06})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 15.0%, 14.0% and 71.0% thereby to prepare a blended phosphor slurry. The blended-slurry was then dropped on the LED, and the dropped slurry was subjected to a heat treatment at a temperature of 140° C. and the silicone resin was hardened and cured thereby to manufacture a white LED according to Comparative Example 1.

COMPARATIVE EXAMPLE 2

There were prepared: an europium activated alkaline earth chloro-phosphate phosphor having a composition of $(Sr_{0.59} Ba_{0.39} Ca_{0.01} Eu_{0.01})_{10} (PO_4)_6.Cl_2$ as blue emission phosphor; an europium and manganese activated aluminate phosphor having a composition of $(Ba_{0.864} Eu_{0.136}) (Mg_{0.74} Mn_{0.26}) Al_{10} O_{17}$ as green emission phosphor; and an europium activated yttrium oxysulfide phosphor having a composition of $(Y_{0.94} Eu_{0.06})_2 O_2 S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 16.0%, 18.0% and 66.0% thereby to prepare a blended phosphor slurry. The blended slurry was then dropped on the LED, and the dropped slurry was subjected to a heat treatment at a temperature of 140° C. and the silicone resin was hardened and cured thereby to manufacture a white LED according to Comparative Example 2.

Thus manufactured white LEDs, and the liquid crystal displays (liquid crystal display devices) using the white LEDs as backlights according to the respective Examples and Comparative Examples were turned on by passing an electric current of 40 mA through the devices or the like thereby to emit lights. With respect to the respective emitted lights, the color reproduction ranges and the luminance were measured thereby to obtain the results shown in Table 1 hereunder.

Further, as a Conventional Example (Comparative Example 3), there was also manufactured a liquid crystal display in which a cold cathode fluorescent lamp (CCFL) was used as a backlight. The color reproduction range and the luminance in Comparative Example 3 are simultaneously shown in Table 1.

When each of spectra of the respective white LEDs was measured and analyzed, it was confirmed that each of spectra in the respective Examples had: an emission peak value (luminescence peak) in a blue light region having a wavelength of 440-460 nm; a luminescence peak in a green light region having a wavelength of 510-530 nm, and a luminescence peak in a red light region having a wavelength of 620-640 nm, and each of the luminescence peaks in the blue, green and red light regions has a half band width of 50 nm or less.

In contrast, in the spectrum of Comparative Example 1, the peak wavelengths of both the green color region and the red color region were outside the wavelength ranges specified by the present invention. Further, in the spectrum of Comparative Example 2, only the peak wavelength of the red color region was outside the wavelength range specified by the present invention.

TABLE 1

| SAMPLE NO. | COLOR REPRODUCTION RANGE | LUMINANCE mcd |
|---|---|---|
| EXAMPLE 1 | 98 | 400 |
| EXAMPLE 2 | 96 | 400 |
| EXAMPLE 3 | 95 | 410 |
| EXAMPLE 4 | 93 | 430 |
| EXAMPLE 5 | 96 | 410 |
| EXAMPLE 6 | 95 | 420 |
| EXAMPLE 7 | 97 | 405 |
| EXAMPLE 8 | 98 | 390 |
| EXAMPLE 9 | 97 | 410 |
| EXAMPLE 10 | 96 | 400 |
| COMPARATIVE EXAMPLE 1 | 80 | 400 |
| COMPARATIVE EXAMPLE 2 | 87 | 300 |
| CONVENTIONAL EXAMPLE (COMPARATIVE EXAMPLE 3) | 65 | — |

As is clear from the above results shown in Table 1, it was confirmed that each of the white LEDs of Examples and the liquid crystal display using the white LED as a backlight exhibited a high color reproducing property of 90 or more and an excellent emission property such that the luminance could be increased to be 390 mcd or more.

EXAMPLES 11-15

Next, the same procedures as in Example 1 were repeated except that the emission wavelengths of the light emitting diodes were changed as shown in Table 2 thereby to prepare white LEDs of Examples 11-15. In the same manner, the color reproduction range and the luminance of these Examples were measured. In this connection, the blending ratios of the blue, green and red emission phosphors were adjusted such chat the chromaticity of the enisled lights were fallen within a specified range (x=0.250-0.255, y=0.235-0.240). The results are shown in Table 2.

TABLE 2

| SAMPLE NO. | EMISSION WAVELENGH OF LIGHT EMITTING DIODE (nm) | COLOR REPRODUCTION RANGE | LUMINANCE mcd |
|---|---|---|---|
| EXAMPLE 1 | 399 | 98 | 400 |
| EXAMPLE 11 | 360 | 98 | 300 |
| EXAMPLE 12 | 370 | 98 | 460 |
| EXAMPLE 13 | 380 | 98 | 430 |
| EXAMPLE 14 | 410 | 98 | 380 |
| EXAMPLE 15 | 420 | 95 | 100 |

As is clear from the results shown in Table 2, in case of the white LEDs of Examples 11-15 in which the light emitting diode has the emission wavelength of 360-410 nm, it was confirmed that both the color reproduction range and the luminance are high, thus being preferable characteristic.

Next, an example of the liquid crystal display in which thus prepared white LED is used as a backlight will be explained more concretely.

EXAMPLE 16

An electric current of 20 mA is passed through the white LED prepared in Example 1, and the white LED is excited by a light emitting diode naming an emission wavelength of 400 nm. An emission spectrum at this time is shown FIG. 2. As shown in FIG. 2, the emission spectrum of the white LED used in Example 16 comprises: a peak in the blue color region having a wavelength range of 440-450 nm; and a peak in the green color region having a wavelength range of 510-530 nm, and the half bandwidths of the restive peaks are 40 nm and 30 nm that are 50 nm or less.

Figure 6:
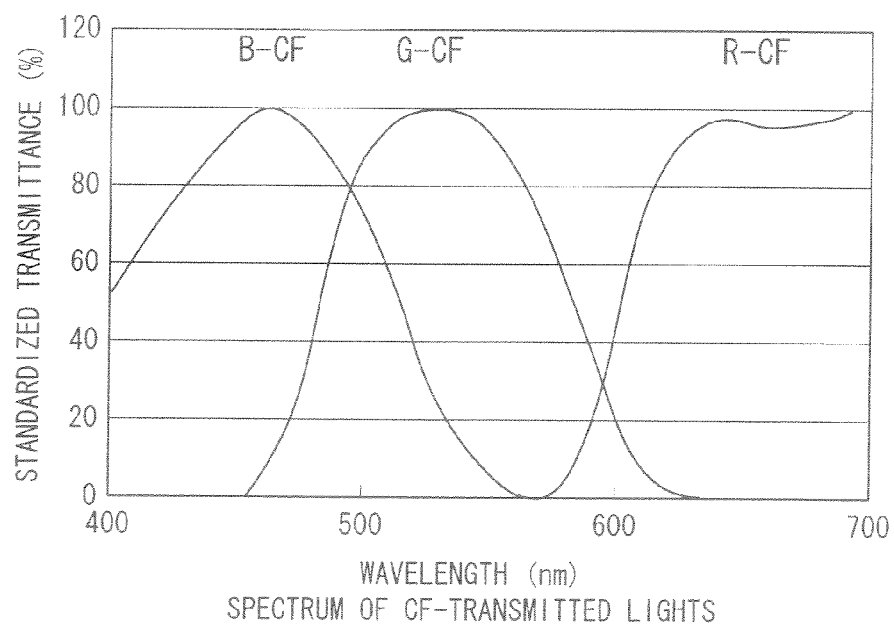
FIG. 6 is a graphic representation showing one example of spectrum of lights transmitted through the color filters used in the liquid crystal displays according to the present invention.

On the other hand, color filters each having a spectrum shown in FIG. 6 were prepared as RGB color filters. The above white LED and the RGB color filters were combined to manufacture a liquid crystal display according to Example 16.

Figure 7:
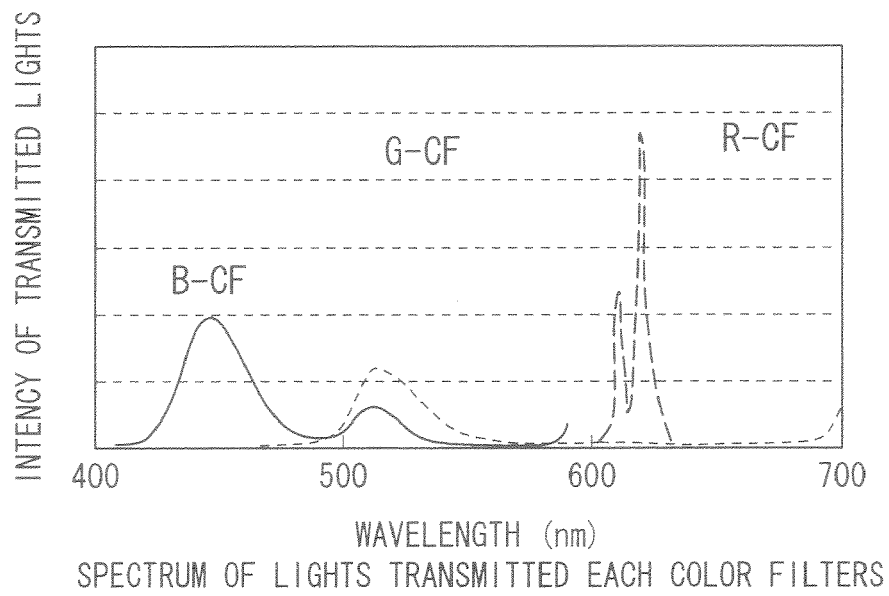
FIG. 7 is a graphic representation showing one example of spectrum of lights transmitted through the color filters in the liquid crystal displays according to the present invention.

Using the white LED having the emission property shown in FIG. 2, a spectrum distribution of the lights transmitted through the color filters having the transmittance spectrum shown in FIG. 6 was measured. The results of the measurement are shown in FIG. 7. In FIG. 7, a solid line (B-CF) indicates a transmittance spectrum of a blue light color filter, a dotted line (G-CF) indicates a transmittance spectrum of a green light color filter, and a thick dotted line (R-CF) indicates a transmittance spectrum of a red light color filter, respectively.

As is clear from the results shown in Table 7, in the transmittance spectrum of the green light color filter, when a spectrum area (area 1) within the wavelength range of 400-500 nm and a spectrum area (area 2) within the wavelength range of 400-600 nm are measured, an area ratio A calculated by an equation: (area 1/area 2)×100(%) is 15% or less. As in the same manner, when a spectrum area (area 3) within the wavelength range of 400-550 nm and a spectrum area (area 4) within the wavelength range of 400-600 nm are measured, an area ratio B calculated by an equation: (area 3/area 4)×100 (%) is 90% or more.

Further, the spectrum of the lights transmitted through the blue light color filter comprises: a first peak (first peak top) existing in a wavelength range of 440 to 450 nm; and a second peak (second peak top) existing in a wavelength range of 510 to 530 nm, and a height of the second peak is ½ or less of a height of the first peak.

The first peak almost coincided with a transmittance peak of the blue light color filter, so that it was confirmed that the light supplied from the backlight was effectively utilized. The first peak is an emission peak caused by the blue emission phosphor used in this Example. The second peak is a light component emitted from the green emission phosphor. When the height of the second peak is set to ½ or less of the height of the first peak, there can be obtained a pure blue light to which a less amount of green light component is mixed.

Furthermore, the color reproducing property of the liquid crystal display was also examined. The color reproducing property was relatively indicated as a ratio which is obtained by plotting emission colors of the liquid crystal display (liquid crystal display device) into a CIE chromaticity diagram to draw a triangle, and by comparing an area of the triangle with the triangle area specified by International Standard (NTSC) indicating an ideal color reproduction range which is assumed to be 100.

That is, the color reproduction range was expressed as a relative value calculated in accordance with a calculation formula of: (an area of the triangular region indicating the emission colors in the CIE chromaticity diagram of the liquid crystal display of Example/the area of the triangular region specified by NTSC)×100 (%).

In the above CIE chromaticity diagram, the liquid crystal display means to able to display the lights having a chromaticity falling within the triangular region obtained by connecting three emission points of blue, green and red colors. Therefore, when the area of the triangular region in the above CIE chromaticity diagram is broader, the liquid crystal display can display more lights having various chromaticity. Thus, it can be said that the liquid crystal display has a broad color reproduction range and an excellent color reproducing property.

Concrete results of the measurement are shown in Tables 3 and 4. In the spectrum of the lights transmitted through one blue color filter in Example 16, the ratio (b2/b1) of a height of the second peak (b2) existing in a wavelength range of 510 to 530 nm to a height of the first peak (b1) existing in a wavelength range of 440 to 450 nm was 0.34, the area ratio A was 9.6% and the area ratio B was 92%.

Further, relating to the color reproducing property, chromaticity coordinates of the lights transmitted through the respective color filters for blue, green, red color lights were (0.14, 0.06), (0.17, 0.69) and (0.69, 0.31) respectively, and the NTSC ratio was 98%, thus indicating a good color reproduction range.

EXAMPLES 17-26

The same procedure as in Example 16 was repeated except that the area ratio A and the area ratio B (half bandwidths) were changed as shown in Table 3 by changing material and thickness of the white LED and the color filter, thereby to prepare liquid crystal displays of Examples 17-26 each having the same structure as Example 16. With respect to Examples of 17-26, the half bandwidth of the respective emission peaks or the like were measured. The results are shown in Tables 3 and 4.

COMPARATIVE EXAMPLE 4

There were prepared: an europium activated alkaline earth chloro-phosphate phosphor having a composition of $(Sr_{0.59}Ba_{0.39}Ca_{0.01}Eu_{0.01})_{10}(PO_4)_6.Cl_2$ as blue emission phosphor;

an europium and manganese activated aluminate phosphor having a composition of $(Ba_{0.864}\ Eu_{0.136})(Mg_{0.74}\ Mn_{0.26})Al_{10}O_{17}$ as green emission phosphor; and an europium activated yttrium oxysulfide phosphor having a composition of $(Y_{0.94}\ Eu_{0.06})_2\ O_2\ S$ as red emission phosphor.

Each of three kinds of phosphors was mixed with silicone resin so that a concentration of the phosphor was 30 mass % thereby to prepare three kinds of phosphor slurries. Then, the respective phosphor slurries were blended at amounts of 16.0%, 18.0% and 66.0% thereby to prepare a blended phosphor slurry. The blended slurry was then dropped on the light emitting diode, and the dropped slurry was subjected to a heat treatment at a temperature of 140° C. and the silicone resin was hardened and cured thereby to manufacture a white LED according to Comparative Example 4.

The half bandwidths of peaks formed at the blue color region and the green color region in an emission spectrum were 60 nm and 30 nm, respectively. By replacing the white LED of Example 22 with the white LED of Comparative Example 4 thereby to prepare a liquid crystal display of Comparative Example 4.

As the result of the same measurements as in Example 22, the ratio (b2/b1) of a height of the second peak (b2) existing in a wavelength range of 510 to 530 nm to a height of the first peak (b1) existing in a wavelength range of 440 to 450 nm was 0.55 which was larger than ½. In addition, although the area ratio B was 90.2%, the area ratio A was 16.2%, and the color reproduction range in terms of the NTSC ratio was 78%, thus being deteriorated.

COMPARATIVE EXAMPLE 5

The same procedure as in Comparative Example 4 was repeated except that the green emission phosphor having a composition of $(Sr, Ba)_2SiO_4:Eu^{2+}$ was adapted thereby to prepare a white LED of Comparative Example 5 having the same structure as in Comparative Example 4.

As the result of the same measurements as in Comparative Example 4, a second peak of the light transmitted through the blue color filter was not observed. The area ratio A was 19.5%, while the area ratio B was 66%, and the color reproduction range in terms of the NTSC ratio was 65%.

In this connection, the inventors had tried so that the peaks of the blue and green color regions formed in an emission spectrum of the white LED would be separated by assuming that they are Gaussian curves. However, satisfactory results could not be obtained, so that a quantitative analysis of the peaks was resigned. However, it is evidently clear that the half bandwidth of the peak in the green color region is sufficiently larger than 50 nm.

Figure 8:
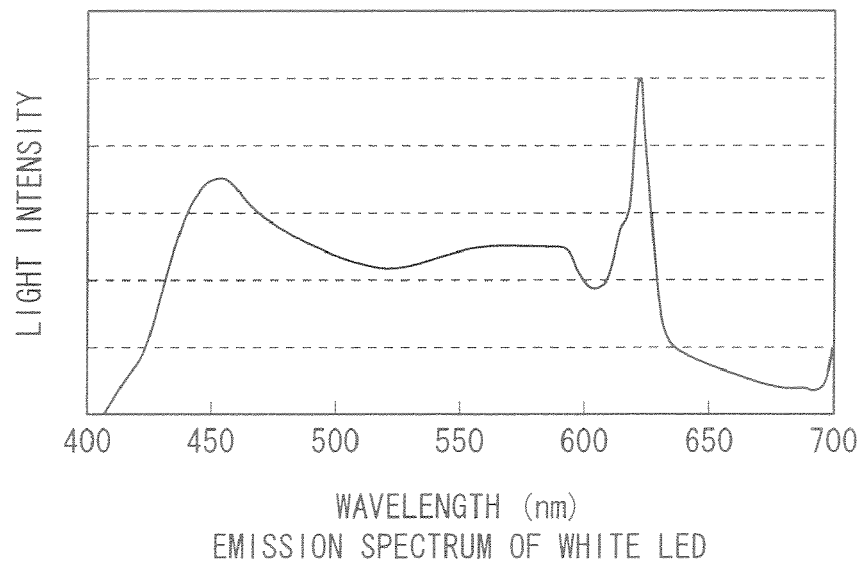
FIG. 8 is a graph showing an emission spectrum of the white LED used in the liquid crystal display according to Comparative Example 5.
Figure 9:
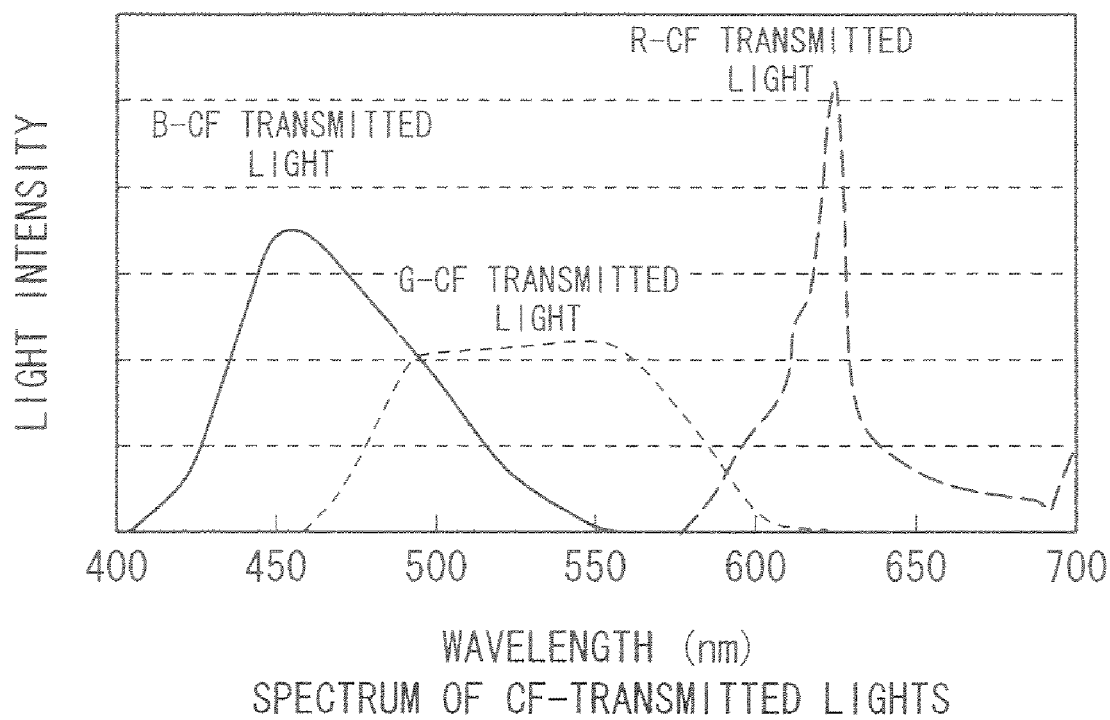
FIG. 9 is a graphic representation showing a spectrum of lights transmitted through the color filters in the liquid crystal display according to Comparative Example 5.

An emission spectrum of the white LED used in the liquid crystal display of Comparative Example 5 is shown in FIG. 8, while a spectrum of the lights transmitted through the respective color filters is shown in FIG. 9.

TABLE 3

| SAMPLE NO. | HALF BANDWIDTH OF PEAK IN BLUE EMISSION REGION HAVING WAVELENGTH OF 440~450 nm | HALF BAND WIDTH OF PEAK IN GREEN EMISSION REGION HAVING WAVELENGTH OF 510~530 nm |
|---|---|---|
| EXAMPLE 16 | 40 (nm) | 30 (nm) |
| EXAMPLE 17 | 40 | 30 |
| EXAMPLE 18 | 40 | 30 |
| EXAMPLE 19 | 40 | 30 |
| EXAMPLE 20 | 40 | 30 |
| EXAMPLE 21 | 40 | 30 |
| EXAMPLE 22 | 40 | 30 |
| EXAMPLE 23 | 40 | 30 |
| EXAMPLE 24 | 40 | 30 |
| EXAMPLE 25 | 40 | 30 |
| EXAMPLE 26 | 40 | 30 |
| COMPARATIVE EXAMPLE 4 | 60 | 30 |
| COMPARATIVE EXAMPLE 5 | OVER 50 | OVER 50 |

TABLE 4

| | B-CF | G-CF | | | | G-CF | |
|---|---|---|---|---|---|---|---|
| SAMPLE NO. | 500 nm TRANSMITANCE/ MAX TRANSMITTANCE | 500 nm TRANSMITANCE/ MAX TRANSMITTANCE | 600 nm TRANSMITANCE/ MAX TRANSMITTANCE | COLOR REPRODUCTION RANGE (%) | B-CF TRANAMITTED LIGHT b2/b1 | TRANAMITTED LIGHT g500/g600 | g550/g600 |
| EXAMPLE 16 | 0.73 | 0.88 | 0.16 | 98.0 | 0.34 | 9.6 | 91.7 |
| EXAMPLE 17 | 0.78 | 0.88 | 0.16 | 97.6 | 0.38 | 9.6 | 92.5 |
| EXAMPLE 18 | 0.83 | 0.88 | 0.16 | 95.2 | 0.45 | 9.6 | 92.1 |
| EXAMPLE 19 | 0.73 | 0.91 | 0.23 | 93.5 | 0.34 | 11.6 | 91.2 |
| EXAMPLE 20 | 0.78 | 0.91 | 0.23 | 91.7 | 0.38 | 11.2 | 90.6 |
| EXAMPLE 21 | 0.83 | 0.91 | 0.23 | 89.3 | 0.43 | 11.6 | 91.0 |
| EXAMPLE 22 | 0.73 | 0.93 | 0.33 | 84.2 | 0.33 | 14.5 | 90.4 |
| EXAMPLE 23 | 0.78 | 0.93 | 0.33 | 82.4 | 0.39 | 14.7 | 90.4 |
| EXAMPLE 24 | 0.83 | 0.93 | 0.33 | 82.5 | 0.43 | 14.8 | 90.4 |
| EXAMPLE 25 | 0.88 | 0.88 | 0.16 | 92.2 | 0.50 | 14.9 | 91.7 |
| EXAMPLE 26 | 0.88 | 0.91 | 0.23 | 86.4 | 0.48 | 11.6 | 91.0 |

COMPARATIVE EXAMPLEs 6-7

In the liquid crystal display of Example 16, color filters of which thickness was controlled were combined thereby to manufacture liquid crystal displays of Comparative Examples 6-7.

TABLE 5

| SAMPLE NO. | B-CF 500 nm TRANSMITANCE/ MAX TRANSMITTANCE | G-CF 500 nm TRANSMITANCE/ MAX TRANSMITTANCE | G-CF 600 nm TRANSMITANCE/ MAX TRANSMITTANCE | COLOR REPRODUCTION RANGE (%) | B-CF TRANAMITTED LIGHT b2/b1 | G-CF TRANAMITTED LIGHT g500/g600 | g550/g600 |
|---|---|---|---|---|---|---|---|
| COMPARATIVE EXAMPLE 6 | 0.92 | 0.96 | 0.48 | 63.5 | 0.48 | 18.5 | 87 |
| COMPARATIVE EXAMPLE 7 | 0.92 | 0.97 | 0.41 | 77.3 | 0.46 | 15.2 | 89 |

In Tables 4 and 5, "b2/b1" is a ratio of a height of the second peak (b2) to a height of the first peak (b1), while "g500/g600" is a ratio of the spectrum area (g500) composed of light components having wavelengths of 400 to 500 nm with respect to a spectrum area (g600) composed of light components having wavelengths of 400 to 600 nm. In contrast, "g550/g600" is a ratio of the spectrum area (g550) composed of light components having wavelengths of 400 to 550 nm with respect to a spectrum area (g600) composed of light components having wavelengths of 400 to 600 nm.

As is clear from the results shown in Table 5, even if the color filters are made from the same material, the color reproducing property of the liquid crystal display becomes greatly different when the thickness of the color filter was changed. Namely, if the compatibility between the emission spectrum of the white LED and the RGB color filters would not be taken into consideration unlike she present invention, a liquid crystal display having an excellent color reproducing property cannot be obtained.

INDUSTRIAL APPLICABILITY

As described above, the white LED according to the present invention exhibits a high luminance and is excellent in color reproducing property. Further, according to the liquid crystal display of this invention, since one spectrum of the backlight using the unite LED and the transmission spectrum of the color filters are suitably controlled, the liquid crystal display is excellent in color reproducing property. Therefore, all of the backlight and the liquid crystal display each using the white LED of the present invention can exhibit the high luminance and the excellent color reproducing property. In addition, unlike the conventional cold cathode fluorescent lamp (CCFL), there is no need to use harmful mercury, so that the problem of polluting environment would not occur.

The invention claimed is:

1. A white LED comprising:
an ultraviolet emitting diode or a purple light emitting diode; and
phosphors for emitting visible lights including blue light, green light and red light;
wherein an emission spectrum of said white LED has: a first luminescence peak in a blue light region having a wavelength of 440-460 nm; a second luminescence peak in a green light region having a wavelength of 510-530 nm; and a third luminescence peak in a red light region having a wavelength of 620-640 nm,
wherein said phosphor for emitting blue color light is an europium activated halo-phosphate phosphor expressed by a general formula 1: $(Sr_{1-x-y} Ba_x Ca_y Eu_z)_{10} (PO_4)_6 Cl_2$ in which x, y, z respectively satisfy the relations $x<0.2$, $y<0.1$ and $0.005<z<0.1$,
wherein said phosphor for emitting green color light is an europium and manganese activated aluminate phosphor expressed by a general formula 2: $(Ba_{1-x-y-z} Sr_x Ca_y Eu_z)(Mg_{1-u}Mn_u) Al_{10}O_{17}$ in which x, y, z, u respectively satisfy the relations $x<0.5$, $y<0.1$, $0.15<z<0.4$ and $0.3<u<0.6$, and
wherein said phosphor for emitting red color light is an europium activated lanthanum oxysulfide phosphor expressed by a general formula 3: $(La_{1-x-y} Eu_x M_y)_2O_2S$ in which M is at least one element selected from Sb and Sn, and x, y respectively satisfy the relations $0.01<x<0.15$, and $y<0.03$.

2. The white LED according to claim 1, wherein each of said first to third luminescence peaks in the blue, green and red light regions has a half band width of 50 nm or less.

3. The white LED according to claim 1, wherein a luminescence intensity of said ultraviolet emitting diode or the purple light emitting diode has a peak value in a wavelength range of 360-410 nm.

4. A backlight comprising the white LED according to claims 1 or 2.

5. A liquid crystal display comprising:
a white LED according to claim 1;
a backlight using the white LED; and
color filters for filtering blue, green, red color lights,
wherein: a percentage of a spectrum area composed of light components having been transmitted the green color filter and having wavelengths of 400 to 500 nm with respect to a spectrum area composed of light components having wavelengths of 400 to 600 nm is 15% or less; and
a percentage of a spectrum area composed of light components having wavelengths of 400 to 550 nm with respect to the spectrum area composed of light components having wavelengths of 400 to 600 nm is 90% or more.

6. The liquid crystal display according to claim 5, wherein a light emitting wavelength of the light emitting diode used in said white LED is 360 to 410 nm.

7. The liquid crystal display according to claim 5, wherein the spectrum of the lights transmitted the blue color filter comprises: a first peak top existing in a wavelength range of 440 to 450 nm; and a second peak top existing in a wavelength range of 510 to 530 nm; and a height of the second peak top is ½ or less of a height of the first peak top.

8. The liquid crystal display according to any one of claims 5 to 7, wherein a transmission factor at the blue color filter is 90% or less of a maximum transmission factor and a transmission factor at the green color filter is 95% or less of a maximum transmission factor when a light having wavelength of 500 nm is transmitted; and a transmission factor at the green color filter is 40% or less of a maximum transmission factor when a light having wavelength of 600 nm is transmitted.

9. A liquid crystal display comprising:
a backlight using a white LED; and
color filters for filtering blue, green, red color lights,
wherein: a percentage of a spectrum area composed of light components having been transmitted the green color filter and having wavelengths of 400 to 500 nm with respect to a spectrum area composed of light components having wavelengths of 400 to 600 nm is 15% or less; and
a percentage of a spectrum area composed of light components having wavelengths of 400 to 550 nm with respect to the spectrum area composed of light components having wavelengths of 400 to 600 nm is 90% or more.

* * * * *